(12) United States Patent
Schuelein

(10) Patent No.: US 6,956,421 B1
(45) Date of Patent: Oct. 18, 2005

(54) SLAVE-LESS EDGE-TRIGGERED FLIP-FLOP

(75) Inventor: Mark E. Schuelein, Tempe, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/616,810

(22) Filed: Jul. 10, 2003

(51) Int. Cl.[7] .............................................. H03K 3/12
(52) U.S. Cl. ..................................... 327/201; 327/211
(58) Field of Search ............................. 327/199–203, 327/207–212, 214–219; 326/95–98, 46; 365/208, 365/154–156

(56) References Cited

U.S. PATENT DOCUMENTS

| | | | | |
|---|---|---|---|---|
| 3,812,384 A | * | 5/1974 | Skorup | ........................ 365/154 |
| 5,469,079 A | * | 11/1995 | Mahant-Shetti et al. | ...... 326/46 |
| 6,369,631 B1 | * | 4/2002 | Sachdev et al. | ............. 327/211 |
| 6,433,601 B1 | * | 8/2002 | Ganesan | ...................... 327/202 |
| 6,509,772 B1 | * | 1/2003 | Ye et al. | ...................... 327/211 |
| 6,556,059 B2 | * | 4/2003 | Afghahi | ...................... 327/199 |
| 6,566,927 B2 | * | 5/2003 | Park et al. | ................... 327/211 |
| 6,624,677 B1 | * | 9/2003 | Wissel | ......................... 327/202 |
| 6,737,898 B2 | * | 5/2004 | Afghahi | ...................... 327/199 |

* cited by examiner

*Primary Examiner*—Minh Nguyen
(74) *Attorney, Agent, or Firm*—The Law Offices of John C. Scott, LLC

(57) ABSTRACT

An edge-triggered flip flop includes a clocking portion having first and second transistor stacks that are coupled to first and second storage nodes of a memory element, respectively. In at least one embodiment, a clock signal is applied to an input of at least one transistor in each stack and a delayed and possibly inverted version of the clock signal is applied to an input of at least one other transistor in each stack to clock new data into the memory element.

14 Claims, 4 Drawing Sheets

SLAVE-LESS EDGE-TRIGGERED FLIP-FLOP

FIELD OF THE INVENTION

The invention relates generally to digital devices and, more particularly, to edge- triggered flip flops.

DETAILED DESCRIPTION

Figure 1:
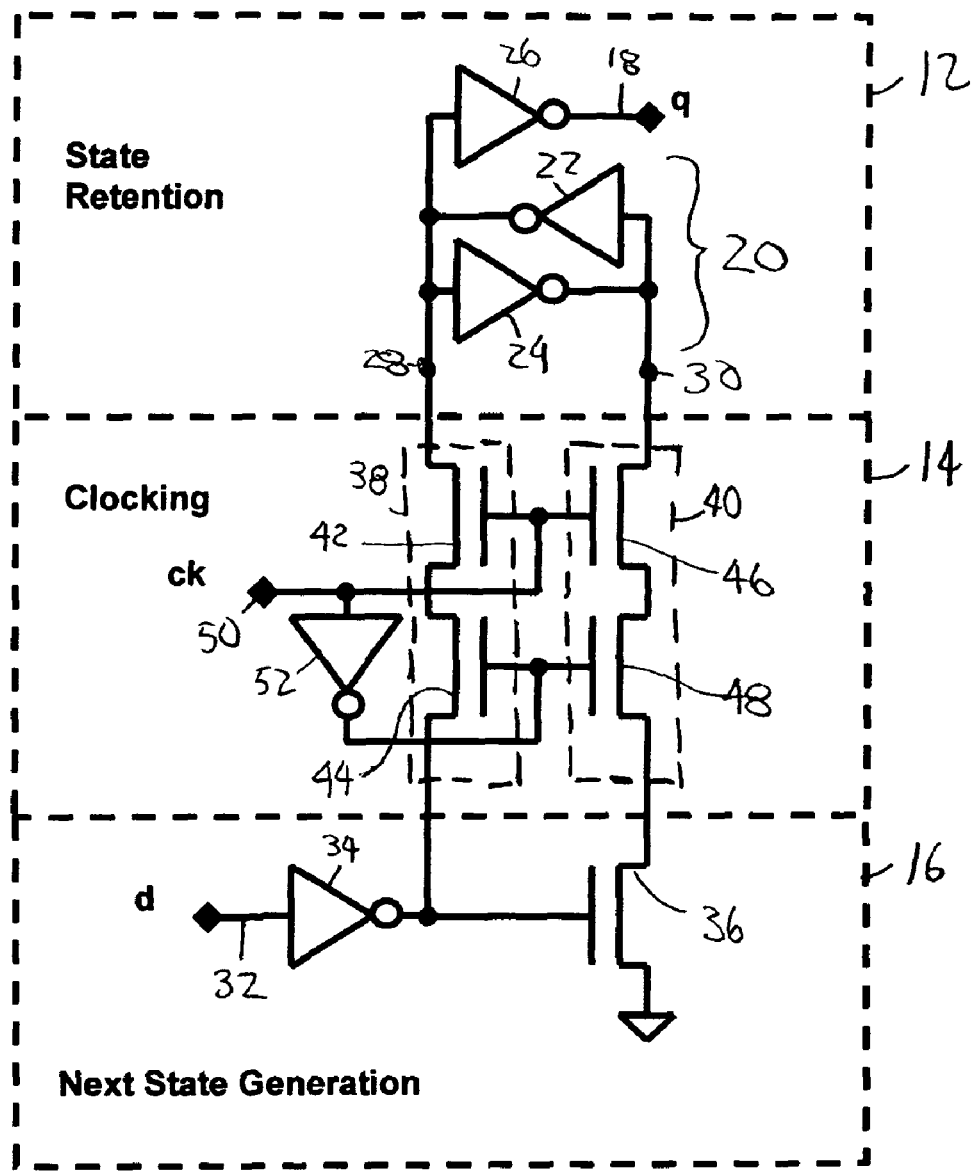
FIG. 1 is a schematic diagram illustrating an example slave-less edge-triggered flip flop in accordance with an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 is a schematic diagram illustrating an example slave-less edge-triggered flip flop 10 in accordance with an embodiment of the present invention. As illustrated, the slave-less edge-triggered flip flop 10 is depicted comprising one or more of a state retention portion 12, a clocking portion 14, and a next state generation portion 16. The state retention portion 12 is operative for storing a bit of digital data. The stored data bit is made available at an output 18 of the flip flop 10. The next state generation portion 16 is operative for receiving, from an exterior source, a new bit of digital data to be stored in the state retention portion 12. The clocking portion 14 is operative for transferring the new bit of digital data from the next state generation portion 16 to the state retention portion 12 in response to a clock signal (ck). The slave-less edge- triggered flip flop 10 is capable of providing operation similar to that of a master-slave flip flop, without requiring a slave storage element. Because there is no slave storage element, the slave-less edge-triggered flip flop 10 may be implemented with fewer transistors and thus take up significantly less space on a semiconductor chip than a comparable master-slave flip flop. The use of fewer transistors may also increase the energy efficiency of the flip flop. The slave-less edge-triggered flip flop 10 is also capable of providing performance similar to that of a latch with a pulsed clock, without requiring the generation of a pulsing clock and without the complexity involved in distributing such a pulsed clock.

In the embodiment illustrated in FIG. 1, the state retention portion 12 of the flip flop 10 is depicted comprising one or more of a latch 20 having first and second inverters 22, 24 arranged in a cross-coupled relationship as a data storage element. Other forms of data storage element may alternatively be used including, for example, any pair of cross-coupled logic inverting gates such as a NOR gate and an inverter, a NAND gate and an inverter, two NAND gates, two complex and-or-inverts, and others. The latch 20 includes first and second storage nodes 28, 30 that will typically carry complementary data values when a bit of data is stored within the latch 20. To store a particular data value within the latch 20, current may be drawn downward from the first or second storage node 28, 30 (depending on the data value to be stored) until the latch 20 reaches a stable state (i.e., latches the data bit). This process of drawing current downward from a storage node will be referred to herein as pulling down on the node. As shown in FIG. 1, another inverter 26 may be provided to buffer the output of the flip flop 10. Thus, the bit value that is on the second storage node 30 in the embodiment of FIG. 1 will be the data value output by the flip flop 10 at output 18.

The next state generation portion 16 of the flip flop 10 receives a new data bit value (d) to be stored in the state retention portion 12, at an input 32 thereof. In the illustrated embodiment, the next state generation portion 16 includes an inverter 34 to invert the new data bit value. The next state generation portion 16 also includes a transistor 36 having a gate terminal connected to the output of the inverter 34. In the illustrated embodiment, the transistor 36 is an N-type insulated-gate field effect transistor (IGFET) (e.g., an N-type metal-oxide-semiconductor field effect transistor or MOSFET). Other transistor types may alternatively be used. When a logic high value is received at input 32, a logic low value is generated on the output of the inverter 34 and the transistor 36 is turned off. Conversely, when a logic low value is received at input 32, a logic high value is generated on the output node of the inverter 34 and the transistor 36 is turned on.

As illustrated in FIG. 1, the clocking portion 14 of the flip flop 10 includes a first transistor stack 38 and a second transistor stack 40. The first and second transistor stacks 38, 40 are used to pull down on an appropriate storage node of the state retention portion 12 of the flip flop 10 to transfer the new data bit value from the next state generation portion 16 to the state retention portion 12 for storage. The first transistor stack 38 is connected between the first storage node 28 of the state retention portion 12 and the output of the inverter 34 of the next state generation portion 16. The second transistor stack 40 is connected between the second storage node 30 of the state retention portion 12 and a drain/source terminal of the transistor 36. The other drain/source terminal of the transistor 36 may be coupled to ground. When the output of the inverter 34 is logic low and the flip flop 10 is clocked, the first transistor stack 38 will pull down on the first storage node 28 and a logic high data value will be stored within the latch 20. The transistor 36 will be off at this point, so little or no current will flow downward through the second transistor stack 40. When the output of the inverter 34 is logic high and the flip flop 10 is clocked, the second transistor stack 40 will pull down on the second storage node 30 of latch 20 to store a logic low value therein. Little or no current will flow downward through the first transistor stack 38 during this time.

In the embodiment illustrated in FIG. 1, the first transistor stack 38 includes a first transistor 42 in series with a second transistor 44 and the second transistor stack 40 includes a third transistor 46 in series with a fourth transistor 48. In other embodiments, the transistor stacks 38, 40 may each include more than two transistors. In the illustrated embodiment, the first, second, third, and fourth transistors 42, 44, 46, 48 are N-type IGFETs, although other transistor types or combinations of different types may alternatively be used. A clock input node 50 is connected to the gate terminals of the first and third transistors 42, 46. An inverter 52 is connected between the clock input node 50 and the gate terminals of the second and fourth transistors 44, 48 so that an inverted clock signal is applied to these gate terminals. Because the inverter 52 has some delay, the inverted clock signal that is applied to the gate terminals of the second and fourth transistors 44, 48 is delayed with respect to the clock signal applied to the gate terminals of the first and third transistors 42, 46.

In at least one implementation, the clock signal received at the clock input node 50 is a square wave or square wave-like signal that alternates between logic high and logic low values. When this clock signal is logic low, the first and third transistors 42, 46 are turned off and little or no current can flow through the first and second transistor stacks 38, 40. When the clock signal subsequently transitions to a logic high value, however, the first and third transistors 42, 46 turn on. Because there is a finite delay within the inverter 52, a logic high value will remain on the gate terminals of the second and fourth transistors 44, 48 for a short period of time before these transistors are turned off by the inverted clock signal. During the time that both transistors in each stack 38, 40 are on, one of storage nodes 28, 30 of the latch 20 within the state retention portion 12 will be pulled down based on the value of the new data bit received by the next state generation portion 16. The new data bit will thus be transferred to the state retention portion 12 for storage. The inverter 52 may be designed so that the delay thereof is adequate to allow the data transfer to reliably occur. Although illustrated as a conventional inverter, it should be appreciated that any form of inversion device that is capable of inverting a digital signal may be used as the inverter 52 (or any of the other inverters described herein). In at least one embodiment, the inverter 52 is replaced by a non-inverting delay element and the second and fourth transistors 44, 48 are replaced with P-type IGFETs to achieve the same or similar result described above. Other modifications may also be made.

Figure 2:
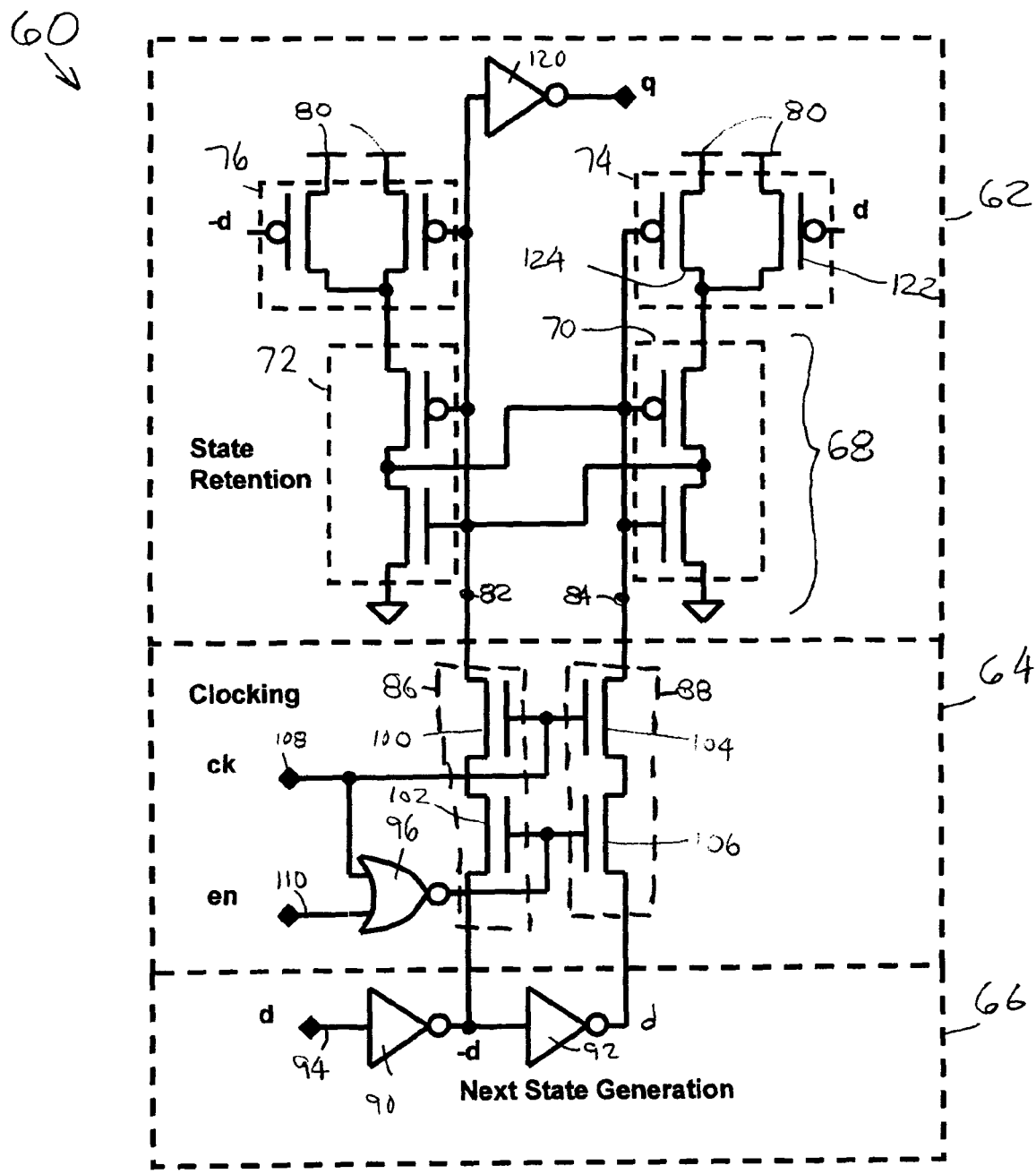
FIG. 2 is a schematic diagram illustrating an example slave-less edge-triggered flip flop in accordance with another embodiment of the present invention.

FIG. 2 is a schematic diagram illustrating an example slave-less edge-triggered flip flop 60 in accordance with an embodiment of the present invention. As illustrated, the slave-less edge-triggered flip flop 60 includes: a state retention portion 62, a clocking portion 64, and a next state generation portion 66. These portions operate in a similar manner to the corresponding elements discussed previously, although some modifications have been made. The state retention portion 62 includes a latch 68 having first and second inverters 70, 72 connected in a cross-coupled configuration. The latch 68 includes first and second storage nodes 82, 84. As before, other types of storage element may alternatively be used. An inverter 120 may also be provided to buffer the output of the flip flop 60. The clocking portion 64 includes first and second transistor stacks 86, 88 that may be used to pull down the first storage node 82 or the second storage node 84 based on a new data value received by the next state generation portion 66.

The first stack 86 includes a first transistor 100 and a second transistor 102 and the second stack 88 includes a third transistor 104 and a fourth transistor 106. The next state generation portion 66 includes two inverters 90, 92. The first inverter 90 inverts a new data bit (d) received at an input 94 to achieve a complementary bit (−d) at an output thereof. The second inverter 92 then inverts the complementary bit (−d) to achieve the original bit (d) at an output thereof. The outputs of the two inverters 90, 92 within the next state generation portion 66 are coupled to the lower ends of the first and second transistor stacks 86, 88 in a manner that allows either the first or the second storage node 82, 84 to be pulled down when the flip flop 60 is clocked. The inverters 90, 92 within the next state generation portion 66 may be conventional inverters or any other form of device or structure that may be used to invert a digital signal. Other structures may alternatively be used.

The clocking portion 64 of the flip flop 60 includes a NOR gate 96 having two inputs and an output. A first input of the NOR gate 96 is connected to a clock input node 108 of the clocking portion 64. The output of the NOR gate 96 is connected to the gate terminals of the second and fourth transistors 102, 106. The second input of the NOR gate 96 serves as an enable input 110 of the flip flop 60. When a logic low value is applied to the enable input 110, the flip flop 60 is enabled and the NOR gate 96 acts as an inverter between the clock input node 108 and the gate terminals of the second and fourth transistors 102, 106 (i.e., the clocking portion 64 operates substantially as discussed previously). When a logic high value is applied to the enable input 110, the output of the NOR gate 96 will be logic low regardless of the value on the clock input node 108. The second and fourth transistors 102, 106 will thus be turned off and the flip flop 60 will be disabled (i.e., no new data transfers are possible). By disabling the flip flop 60 in this manner, power is saved by both preventing the state change of the latch 68 and by reducing the clocking activity of the clocking portion 64.

In addition to the latch 68, the state retention portion 62 of the flip flop 60 may further include a first pull up circuit 74 and a second pull up circuit 76. The first and second pull up circuits 74, 76 are operative for providing stronger pull up strength during state change without causing larger current on the side of the flip flop that is pulling down. This may be accomplished by using a larger transistor in parallel with a smaller transistor within each of the pull up circuits 74, 76 (i.e., multiple pull up paths). For example, in the illustrated embodiment, the first pull up circuit 74 includes a first transistor 122 and a second transistor 124 that are each connected between a power supply node 80 and an upper power node of the first inverter 70. The first and second transistors 122, 124 of the first pull up circuit 74 are P-type IGFETs (e.g., PMOS) in the illustrated embodiment, although other circuit configurations may alternatively be used. In at least one implementation, the first transistor 122 within the first pull-up circuit 74 is larger than the second transistor 124. The larger transistor may thus provide increased current to the P-device in the inverter when the next state data would indicate this node to be pulled up. The smaller transistor is used to keep a weaker source of current to retain the state value when no new data is being stored in the state retention latch. The second pull up circuit 76 may perform in substantially the same manner. By using the pull up circuits 74, 76, speed may be increased while power consumption is kept down.

In addition to the advantages described above, the flip flop structures of the present invention allow further functions to be added to a flip flop in a simple and efficient manner. For example, a "clear" function may be added to the flip flop 10 of FIG. 1 using a single transistor connected between node 30 and ground with its gate input being the signal clear, whereas a conventional flip flop design typically requires four transistors to implement the same function. Similarly, a "preset" function may be added to the flip flop 10 using a single transistor connected between node 28 and ground with its gate being the signal preset, whereas a conventional flip flop design typically requires four transistors. Other functions may also be added in this manner using less transistors than were required by past designs.

Figure 4:
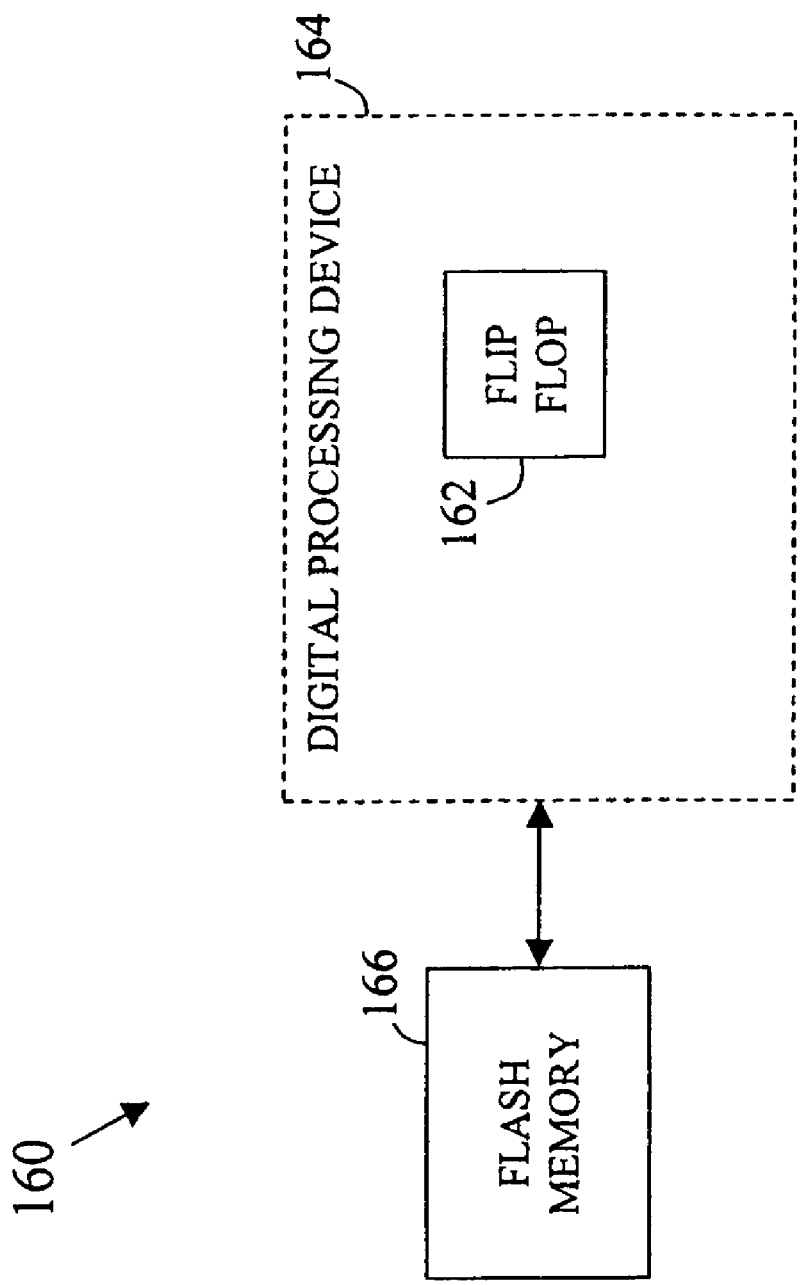
FIG. 4 is a block diagram illustrating a computing system in accordance with an embodiment of the present invention.

In at least one embodiment of the present invention, as illustrated in FIG. 4 a slave-less edge-triggered flip flop 162 (e.g., flip flop 10 of FIG. 1, flip flop 60 of FIG. 2, etc.) is implemented within a digital processing device 164 (e.g., a microprocessor, a digital signal processor (DSP), a field programmable gate array (FPGA), a reduced instruction set computer (RISC), a complex instruction set computer (CISC), an application specific integrated circuit (ASIC), etc.) to serve as a data storage element within the device. The digital processing device 164 may be coupled to, for example, an external memory 166 (e.g., flash memory, dynamic random access memory (DRAM), static random access memory (SRAM), etc.) and/or other functionality to form a computing system 160. One or more slave-less edge-triggered flip flops may be used, for example, as an input/output data buffer for the digital processing device. Many alternative applications also exist.

Figure 3:
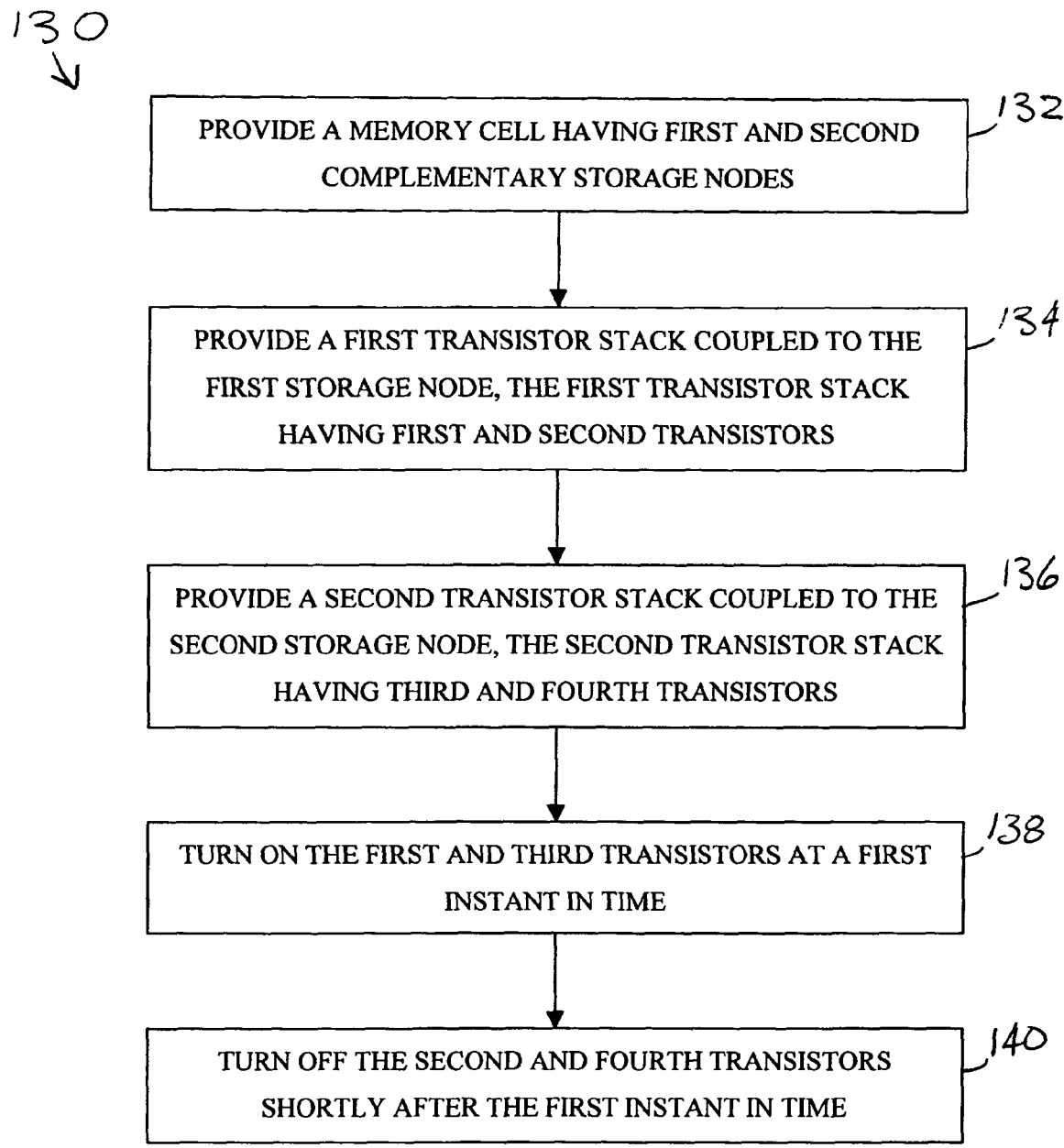
FIG. 3 is a flowchart illustrating an example method for use in storing a data bit within a memory cell in accordance with an embodiment of the present invention.

FIG. 3 is a flowchart illustrating an example method 130 for use in storing a data bit within a memory cell in accordance with an embodiment of the present invention. First, a memory cell is provided that has first and second complementary storage nodes (block 132). A first transistor stack having at least two transistors (e.g., a first transistor and a second transistor) is provided that is coupled to the first storage node (block 134). A second transistor stack having at least two transistors (e.g., a third transistor and a fourth transistor) is provided that is coupled to the second storage node (block 134). Depending on the data bit value to be stored in the memory cell, a distal end of either the first or the second transistor stack may be held at a logic low value. To store the new data bit value within the memory cell, the first and third transistors may be turned on at a first instant in time (block 138) and the second and fourth transistors may be turned off shortly after the first instant in time (block 140). In this manner, either the first or the second transistor stack will temporarily pull down on a corresponding storage node of the memory cell to store the new data value within the cell. In at least one implementation, a clock signal is applied to the gate terminals of the first and third transistors and a delayed, inverted version of the clock signal is applied to the gate terminals of the second and fourth transistors to effect storage of the new data bit. Other techniques may alternatively be used.

In the foregoing detailed description, various features of the invention are grouped together in one or more individual embodiments for the purpose of streamlining the disclosure. This method of disclosure is not to be interpreted as reflecting an intention that the claimed invention requires more features than are expressly recited in each claim. Rather, as the following claims reflect, inventive aspects may lie in less than all features of each disclosed embodiment.

Although the present invention has been described in conjunction with certain embodiments, it is to be understood that modifications and variations may be resorted to without departing from the spirit and scope of the invention as those skilled in the art readily understand. For example, modifications such as changes in the type of transistors used, changes in the doping of the transistors, changes in the locations of elements, etc. may be made to the flip flop circuits described herein without departing from the spirit and scope of the invention. Such modifications and variations are considered to be within the purview and scope of the invention and the appended claims.

What is claimed is:

1. A flip flop comprising:

a state retention portion to store a bit of digital data, said state retention portion having a first storage node and a second storage node; and a clocking portion to transfer a new bit of digital data to said state retention portion in response to a clock signal, said clocking portion including:

a first stack of transistors coupled to said first storage node to draw current from said first storage node when a first digital data value is being transferred to said state retention portion, said first stack of transistors including a first transistor having a gate terminal coupled to receive said clock signal and a second transistor having a gate terminal coupled to receive a delayed, inverted version of said clock signal;

wherein said state retention portion includes a single latch and said single latch includes first and second inverters in a cross coupled configuration;

wherein said state retention portion includes a first pull up circuit connected between said first inverter and a power supply node and a second pull up circuit connected between said second inverter and said power supply node, said first pull up circuit having a first pull up transistor and a second pull up transistor connected in parallel to provide two separate pull up paths for said first inverter.

2. The flip flop of claim 1, wherein:

said first pull up transistor is larger than said second pull up transistor.

3. The flip flop of claim 1, further comprising:

a next state generation portion, connected to said clocking portion, to receive said new bit of digital data from an external source before it is transferred to said state retention portion by said clocking portion.

4. The flip flop of claim 3, wherein:

said next state generation portion includes at least one inversion device to invert a digital signal.

5. The flip flop of claim 4, wherein:

said next state generation portion includes an input node and a first inversion device connected between said input node and an end of said first stack of transistors.

6. The flip flop of claim 1, wherein said clocking portion further comprises:

a second stack of transistors coupled to said second storage node to draw current from said second storage node when a second digital data value is being transferred to said state retention portion, said second digital data value being different from said first digital data value, said second stack of transistors including a third transistor having a gate terminal coupled to receive said clock signal and a fourth transistor having a gate terminal coupled to receive a delayed, inverted version of said clock signal.

7. The flip flop of claim 1, wherein:
said second pull up circuit includes a third pull up transistor and a fourth pull up transistor connected in parallel to provide two separate pull up paths for said second inverter.

8. The flip flop of claim 7, wherein:
said third pull up transistor is larger than said fourth pull up transistor.

9. A computing system comprising:
a digital processing device having at least one flip flop including:
- a state retention portion to store a bit of digital data, said state retention portion having a first storage node and a second storage node, and
- a clocking portion to transfer a new bit of digital data to said state retention portion in response to a clock signal, said clocking portion including a first stack of transistors coupled to said first storage node to draw current from said first storage node when a first digital data value is being transferred to said state retention portion, said first stack of transistors including a first transistor having a gate terminal coupled to receive said clock signal and a second transistor having a gate terminal coupled to receive a delayed, inverted version of said clock signal;
wherein said state retention portion includes a single latch and said single latch includes first and second inverters in a cross coupled configuration, wherein said state retention portion includes a first pull up circuit connected between said first inverter and a power supply node and a second pull up circuit connected between said second inverter and said power supply node, said first pull up circuit having a first pull up transistor and a second pull up transistor connected in parallel to provide two separate pull up paths for said first inverter; and
a flash memory coupled to said digital processing device.

10. The computing system of claim 9, wherein:
said clocking portion further comprises a second stack of transistors coupled to said second storage node to draw current from said second storage node when a second digital data value is being transferred to said state retention portion, said second digital data value being different from said first digital data value, said second stack of transistors including a third transistor having a gate terminal coupled to receive said clock signal and a fourth transistor having a gate terminal coupled to receive a delayed, inverted version of said clock signal.

11. The computing system of claim 9, wherein:
said clocking portion comprises a clock node to receive said clock signal and an inversion device coupled between said clock node and said gate of said second transistor.

12. The computing system of claim 9, wherein:
said first pull up transistor is larger than said second pull up transistor.

13. The computing system of claim 9, wherein:
said second pull up circuit includes a third pull up transistor and a fourth pull up transistor connected in parallel to provide two separate pull up paths for said second inverter.

14. The computing system of claim 13, wherein:
said third pull up transistor is larger than said fourth pull up transistor.

* * * * *